United States Patent [19]
Fuesser et al.

[11] Patent Number: 6,101,715
[45] Date of Patent: Aug. 15, 2000

[54] MICROCOOLING DEVICE AND METHOD OF MAKING IT

[75] Inventors: Hans-Juergen Fuesser, Gerstetten-Dettingen; Reinhard Zachai, Guenzburg; Wolfram Muench, Mannheim; Tim Gutheit, Ulm, all of Germany

[73] Assignee: DaimlerChrysler AG, Stuttgart, Germany

[21] Appl. No.: 09/016,312

[22] Filed: Jan. 30, 1998

Related U.S. Application Data

[62] Division of application No. 08/639,106, Apr. 22, 1996, abandoned.

[30] Foreign Application Priority Data

Apr. 20, 1995 [DE] Germany .......................... 195 14 548

[51] Int. Cl.[7] .................................................. B23P 15/26
[52] U.S. Cl. ............... 29/890.03; 165/80.4; 165/104.33; 165/170; 361/384; 361/385; 257/712
[58] Field of Search ................... 165/80.4, 170, 165/104.26, 104.33, 104.34; 257/712, 81; 359/288; 29/890.03; 361/384, 385

[56] References Cited

U.S. PATENT DOCUMENTS

| | | | |
|---|---|---|---|
| 4,079,410 | 3/1978 | Schierz | 165/80.4 |
| 4,109,707 | 8/1978 | Wilson et al. | 165/80.4 X |
| 4,122,828 | 10/1978 | DiPeri | 165/170 |
| 4,188,996 | 2/1980 | Pellant et al. | 165/80.4 |
| 4,685,512 | 8/1987 | Edelstein et al. | 165/104.26 X |
| 4,854,377 | 8/1989 | Komoto et al. | 165/80.4 |
| 4,884,630 | 12/1989 | Nelson et al. | 165/170 |
| 5,005,640 | 4/1991 | Lapinski et al. | 165/80.4 |
| 5,016,090 | 5/1991 | Galyon et al. | 357/82 |
| 5,034,688 | 7/1991 | Moulene et al. | 324/158 F |
| 5,070,040 | 12/1991 | Pankove | 165/104.33 |
| 5,079,619 | 1/1992 | Davidson | 357/81 |
| 5,099,311 | 3/1992 | Bonde et al. | 165/80.4 |
| 5,146,314 | 9/1992 | Pankove | 165/80.4 |
| 5,179,043 | 1/1993 | Weichold et al. | 165/104.26 |
| 5,275,237 | 1/1994 | Rolfson et al. | 165/80.4 |
| 5,355,942 | 10/1994 | Conte | 165/104.33 |
| 5,388,635 | 2/1995 | Gruber et al. | 165/80.4 |
| 5,495,889 | 3/1996 | Dubelloy | 165/104.33 |
| 5,642,779 | 7/1997 | Yamamoto et al. | 165/185 |
| 5,663,595 | 9/1997 | Shiomi et al | 257/712 |
| 5,976,909 | 11/1999 | Shiomi et al. | 438/105 |

FOREIGN PATENT DOCUMENTS

| | | | |
|---|---|---|---|
| 0587971 | 12/1959 | Canada | 165/80.4 |
| 715352 | 6/1996 | European Pat. Off. . | |
| 4311839 | 10/1994 | Germany . | |
| 3273669 | 12/1991 | Japan | 257/715 |
| 0758524 | 10/1956 | United Kingdom | 165/80.4 |
| 2275571 | 8/1994 | United Kingdom . | |

OTHER PUBLICATIONS

Abstract of Published German Patent Application No. DE 4,233,085.

Ramesham, R., Roppel, T., and Ellis, C. (1991) "Fabrication of Microchannels in Synthetic Polycrystalline Diamond Thin Films for Heat Sinking Applications". *Journal of Electrochemical Society* 138:1706–1709.

*Primary Examiner*—Ira S. Lazarus
*Assistant Examiner*—Terrell McKinnon
*Attorney, Agent, or Firm*—Evenson, McKeown, Edwards & Lenahan, P.L.L.C.

[57] ABSTRACT

A microcooling device and a method for its manufacture. The microcooling device has a high heat conductivity, is designed to accommodate electronic components on its exterior surface, and has a channel structure in its interior through which a coolant fluid can flow to carry heat away from the components. The channel structure is formed by a base substrate provided with a plurality of recesses and a cover layer externally covering the recesses, the cover layer being made from an electrically insulating and heat-conducting material, and being such that the electronic components can be mounted directly thereon.

7 Claims, 3 Drawing Sheets

MICROCOOLING DEVICE AND METHOD OF MAKING IT

This application is a division of application Ser. No. 08/639,106, filed Apr. 22, 1996 now abandoned.

BACKGROUND OF THE INVENTION

This invention relates to a microcooling device for externally supporting electronic components, especially for microelectronic applications, having an internal channel structure through which a coolant can flow, and comprising a base substrate provided with recesses and an external cover layer which covers the recesses in order to form the channel structure. This invention also relates to a method of making a microcooling device comprising creating recesses in a base substrate, and covering the recesses with a sealing cover layer to form a channel structure through which a coolant can flow.

Published German Patent Application No. DE 4,311,839 discloses a microcooling device for cooling electronic components. The microcooling device comprises a base substrate which is structured on one face, and a cover layer disposed on the structured face. To enable electronic components to be disposed on the microcooling device, an insulating layer must be arranged between the electronic components and the material of the microcooling device. As used herein, the term "electronic components" refers to semiconductors, capacitive and inductive elements, resistors, superconductors, circuits made from such components, and the like. A face of the base substrate, which is made of preferably un-doped (i.e. intrinsic) silicon substrate, and which is covered with the covering layer, is provided with recesses which, after the cover layer is sealingly applied, forms on the structured face bearing the recesses a channeled structure through which a preferably liquid coolant flows.

In order to produce the channel structure, the recesses are created, for example by selective etching, in the base substrate which has a flat shape. The recesses are sealingly covered by the cover layer, thereby forming the fluid-carrying channel structure. The cover layer is sealingly bonded to ribs which are composed of the material of the base substrate and which remain standing after the recesses have been created in the base substrate.

Individual electronic components and/or groups of electronic components are disposed, for example by soldering or cementing, on an insulating layer arranged on the microcooling device, so that the waste heat produced by operation of the electronic components is transferred to the coolant through the material of the insulating layer and through the material of the microcooling device. The coolant, which advantageously may be water to which a freezing point lowering substance may optionally be added, absorbs this waste heat and carries it away through the recesses which constitute the channel structure.

Since it is preferred to use un-doped silicon for the base substrate, and since silicon becomes self-conducting beginning at a certain temperature, a microcooling device of this type without any insulating layer is suitable for use only at low temperatures, and even then its suitability is limited. Consequently, it is very desirable to achieve highly efficient cooling of the base substrate. To achieve a large volume flow of coolant and thus realize the best possible cooling effect, the channel structure has relatively large free cross sections. Among other things, these large cross sections are one reason why prior art microcooling devices have had to be made rather large and rather heavy.

SUMMARY OF THE INVENTION

The object of the invention is to provide an improved microcooling device.

Another object of the invention is to provide a microcooling device which removes waste heat especially rapidly and effectively.

A further object of the invention is to provide a microcooling device which can be used at higher working temperatures.

It is also an object of the invention to provide a method of making an improved microcooling device.

These and other objects of the invention have been achieved by providing a microcooling device for externally supporting at least one electronic component in a heat-conducting manner, the microcooling device having an interior channel structure therein through which a coolant can flow, and comprising a base substrate with recesses in one face thereof and an external cover layer covering the recesses in order to form the channel structure, the cover layer being made of an electrically insulating and heat conducting material, and the cover layer being adapted to receive the at least one electronic component directly thereon.

In accordance with further aspects of the invention, the objects have been achieved by providing a method for producing a microcooling device having an interior channel structure therein through which a coolant can flow, the method comprising forming channel-like recesses in a face of a base substrate, and thereafter sealingly covering the recesses by vapor depositing a cover layer over the recesses to form channels of the channel structure; the recesses prior to application of the cover layer having a ratio of depth to maximum clear width of at least 0.5; and the cover layer being made of an electrically insulating and heat-conducting material which preferentially grows three-dimensionally when vapor deposited.

By using a cover layer of electrically insulating material having good thermal conductivity, preferably diamond, the electronic components advantageously can be applied as a thin coating directly to the cover layer, even when higher operating temperatures are anticipated. This makes the insulating material unnecessary, shortens the path of the waste heat flow, and increases the amount of heat eliminated per unit time. Furthermore, the influence of any possible intrinsic self-conduction of the material of the base substrate is also of little consequence, so that the cooling channels can be made with a smaller diameter, and the microcooling device can be made smaller and lighter, or can be populated more densely for the same thickness.

BRIEF DESCRIPTION OF THE DRAWINGS

The invention will be described in further detail hereinafter with reference to illustrative preferred embodiments shown in the accompanying drawings in which.

DETAILED DESCRIPTION OF PREFERRED EMBODIMENTS

Figure 1:
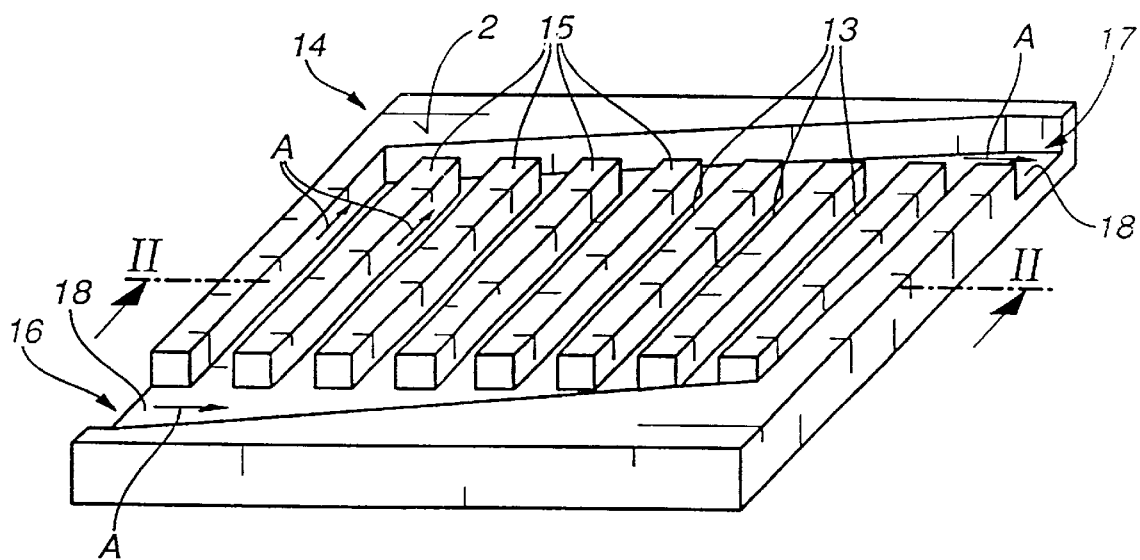
FIG. 1 shows a perspective view of the structured face of a base substrate of a ribbed microcooling device in which the base substrate is provided with pre-formed inlet and outlet passages.

FIG. 1 shows a perspective view of a structured face 2 of a base substrate 14 of a microcooling device 10. The microcooling device 10 is designed to support electronic components 1, such as microcircuits, semiconductors, resistors and the like. The base substrate may be made, for example, of any desired material which has sufficient structural strength and temperature resistance for the intended application and on which diamond can be vapor deposited, e.g. diamond (homoepitaxial deposition) or nickel (Ni), silicon (Si), silicon carbide (SiC), titanium carbide (TiC), molybdenum (Mo), steel, tungsten carbide (WoC), etc. (heteroepitaxial deposition). The structured face 2 of the base substrate 14 is provided with a plurality of upright ribs 15. The ribs 15 form the margins of recesses 13, which are designed to be part of a later-formed channel structure.

Figure 2:
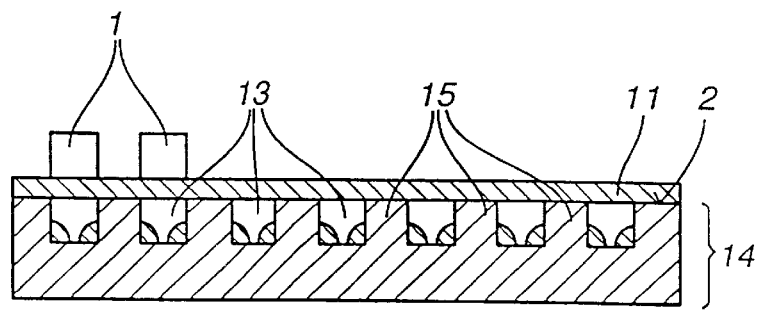
FIG. 2 shows a sectional view taken along line II—II of FIG. 1 through a microcooling device comprising a base substrate and a diamond layer disposed thereon.

To form the desired channel structure, the recesses 13, which are arranged parallel to and equidistant from each other on the structured face 2 of the base substrate 14, as shown in section in FIG. 2, are provided with a cover layer 11, e.g. of diamond or diamond-like carbon (known from the literature). A cover layer of diamond is advantageous because un-doped diamond is an electrical insulator and a good heat conductor, so that the electronic components 1 subsequently to be mounted on the microcooling device, can be disposed directly on the cover layer 11. In this case it is useful to apply the cover layers 11 in thicknesses of 50 $\mu$m to a few hundred $\mu$m, e.g., from about 50 $\mu$m to about 800 $\mu$m. These dimensions are in the same order of magnitude as those of the recesses 13. As used herein, the "width" of a recess refers to its maximum clear width. Preferably, the thickness of the cover layer is greater than 50% of the width of a recess which it covers.

Furthermore, since a cover layer 11 of diamond can be applied in a thickness particularly preferably between 50 $\mu$m and 200 $\mu$m, a flow of heat coming from the electronic components 1 to the channel structure and thus to the coolant, need only travel a short distance, thus assuring good removal of the heat.

Due to the good heat removal, microcooling devices 10 according to the invention can be made small. Furthermore, they can also be provided with a dense array of electronic components 1.

The internal ribs 15, and hence the recesses 13 between the ribs 15, are arranged parallel to and equidistant from one another. In the illustrated preferred embodiment, the height of the ribs 15, and accordingly the depth of the recesses 13, corresponds approximately to the distance between two ribs 15, i.e., to the width of the recesses 13. The ratio of the depth to the clear width of a recess 13 is thus equal to approximately 1. After the cover layer 11 is applied over the recesses 13, the parallel recesses 13 form the actual channel structure.

Such ribs 15 and recesses 13 can be produced in a simple and well-known manner by wet chemistry (i.e., etching) methods and hence by means of an established and inexpensive technology.

After the cover layer 11 is sealingly applied to the structured face 2, the end openings in the area of the recesses 13 constitute inlet and outlet openings of the channel structure for the coolant. At both ends of the recesses 13 there is a transverse recess or groove 18 extending across the ends of the recesses 13. The transverse recesses have a varying width and are in fluid communication with the parallel recesses 13 which form the channel structure.

In conjunction with the cover layer 11 sealingly arranged on the flat face of the base substrate, the transverse recesses 18 form an inlet channel 16 and an outlet channel 17 for a coolant which is provided in order to flow through the channel structure and thus cool the electronic components 1 disposed on the microcooling device 10. Water may advantageously be used as the coolant. It is particularly desirable to use water to which a freezing point lowering substance has been added, such as a salt solution or Glysantin™.

In the direction of coolant flow indicated by arrow A, the inlet channel a diminishing cross section. It is advantageous to match the reduction of the cross section of the inlet passage 16 to the volume of the coolant flowing out of it into the parallel channel structures.

The outlet channel 17 is arranged on the opposite side of the channel structure from the inlet channel 16 and is in fluid communication with inlet channel 16 through the parallel recesses 13 which form the actual channel structure.

The inlet opening of the inlet channel 16, through which the coolant enters the inlet channel 16, is advantageously provided diametrically opposite the outlet opening of the outlet channel 17, through which the coolant exits from the outlet channel.

In the direction of coolant flow indicated by arrow A, the outlet channel 17 has an expanding cross section, the increase of the cross section advantageously being matched to the volume of the coolant flowing out of the channel structure into the outlet channel.

The transverse recesses 18 for the inlet channel 16 and the outlet channel 17 can be produced chemically by selective etching using a known masking technique. Since the inlet channel 16 and the outlet channel 17 are likewise covered by the cover layer 11 of diamond, electronic components 1 can also be mounted in these areas and cooled.

If the cover layer 11 is not a previously formed freestanding cover layer 11, but instead is a diamond layer vapor deposited by a CVD process on the structured flat face 2 of the base substrate 14, care must be taken to see that the maximum width of the channels, i.e., the greatest clear width of the parallel recesses 13 and transverse recesses 18, is not wider than twice the depth of the corresponding channels.

It is desirable to select a ratio of depth to width in the parallel recesses 13 and in the transverse recesses 18 that is greater than 1, preferably greater than 2.

If a cover layer of diamond is vapor deposited only over the recesses 13, it is sufficient if the aforedescribed depth to width ratios are observed only in these recesses 13.

In order to achieve a simple vapor phase deposition of a cover layer 11, particularly a layer of thermally conductive polycrystalline diamond with lattice planes having a statistically distributed orientation, over the parallel recesses 13 and the transverse recesses 18, the cross-sectional variation of the transverse recesses is advantageously realized by maintaining the width of the transverse recesses 18 measured parallel to the flat faces of the base substrate 14 constant, and varying the depth of the transverse recesses 18 in the direction of coolant flow indicated by the arrows A. For the inlet channel 16 this means that the depth of the corresponding transverse recess 18 diminishes in the direction of flow indicated by arrow A, and for the outlet channel 17 the depth of the corresponding transverse recess 18 increases in the direction of flow indicated by arrow A.

A vapor deposited cover layer may be formed of any electrically insulating and thermally conductive material having a sufficiently high surface tension that upon deposition from a vapor phase it grows preferentially in three directions. The conditions for such three-dimensional growth (so-called island growth or Volmer-Weber conditions) are known in the literature; see, for example, Vook, "Structure and Growth of Thin Films", *Int. Met. Rev.*, 27(4):109–211 (1982) and depend to some extent on the material constants which can be found in standard reference works such as Landolt-Boernstein.

Figure 3:
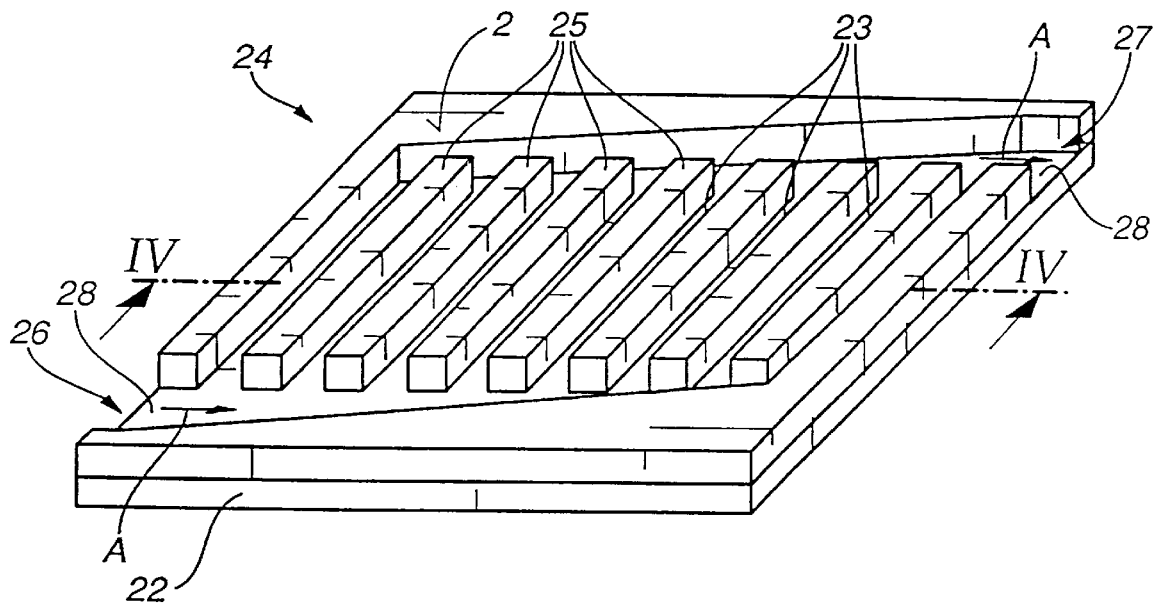
FIG. 3 is a perspective view of a base substrate of a microcooling device essentially comprised of ribs having a continuous diamond coating sealingly disposed on one face.

FIG. 3 shows an additional base substrate 24 for a microcooling device. As in the embodiment in FIG. 1, this base substrate 24 is also provided with recesses 23 aligned parallel to one another. In combination with the cover layer of polycrystalline diamond represented in section along line IV—IV, the parallel recesses 23 form the channel structure of this microcooling device. Furthermore, the base substrate 24 of FIG. 3 likewise has a transverse recess 28 at the free end openings of the parallel recesses 23 so as to form an inlet channel 26 and outlet channel 27 configured similar to channels 16 and 17 according to FIGS. 1 and 2.

Figure 4:
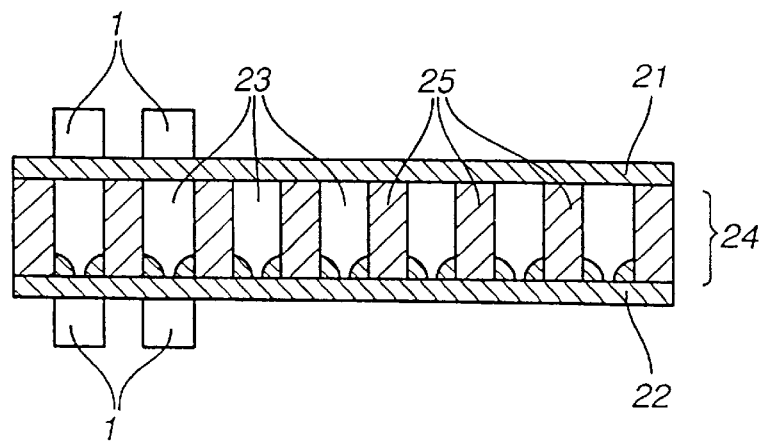
FIG. 4 is a sectional view taken along line IV—IV of FIG. 3 through a microcooling device comprising a base substrate according to FIG. 3 and an additional diamond layer disposed on the remaining face thereof.

Unlike the embodiment according to FIGS. 1 and 2, however, the base substrate 24 of FIGS. 3 and 4 has an additional cover layer 22 on which the ribs 25 are arranged. The ribs 25 separate the parallel recesses from one another and also form marginal boundaries of the microcooling device. Furthermore, the ribs 25 serve as spacers with respect to the two flat sides of the microcooling device 20 on which the electronic components 1 are mounted.

After the upper cover layer 21 of diamond has been applied, especially when deposited by the CVD process, over the recesses 23, the microcooling device according to FIG. 4 with a base substrate 24 according to FIG. 3 has a similar cooling area but one twice as great as the microcooling device of FIG. 2 with a base substrate 14 according to FIG. 1. The microcooling device of FIG. 4 can thus be populated substantially more densely with electronic components 1, namely on both sides.

In this case it is advantageous that not only is the transverse removal of the waste heat improved for electronic components 1 arranged above ribs 25 on one flat side, but on both flat sides of the microcooling device. In a microcooling device 20 according to FIG. 4 with a base substrate according to FIG. 3, virtually the entire exterior surface is therefore available as a cooling surface with electrically insulating and good heat conducting properties, except for the edge surfaces which extend across the sides and contribute only to a slight extent to the overall external area of the microcooling device.

Figure 5:
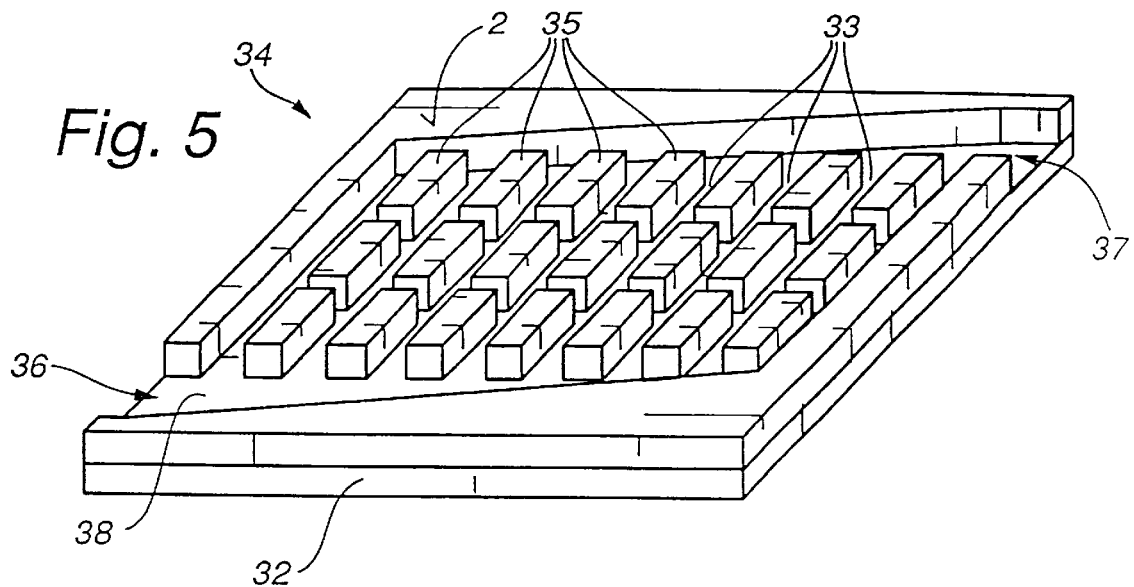
FIG. 5 is a perspective view of a structured surface of a base substrate of a microcooling device provided with protrusions, in which the base substrate is provided with pre-formed inlet and outlet channels.
Figure 6:
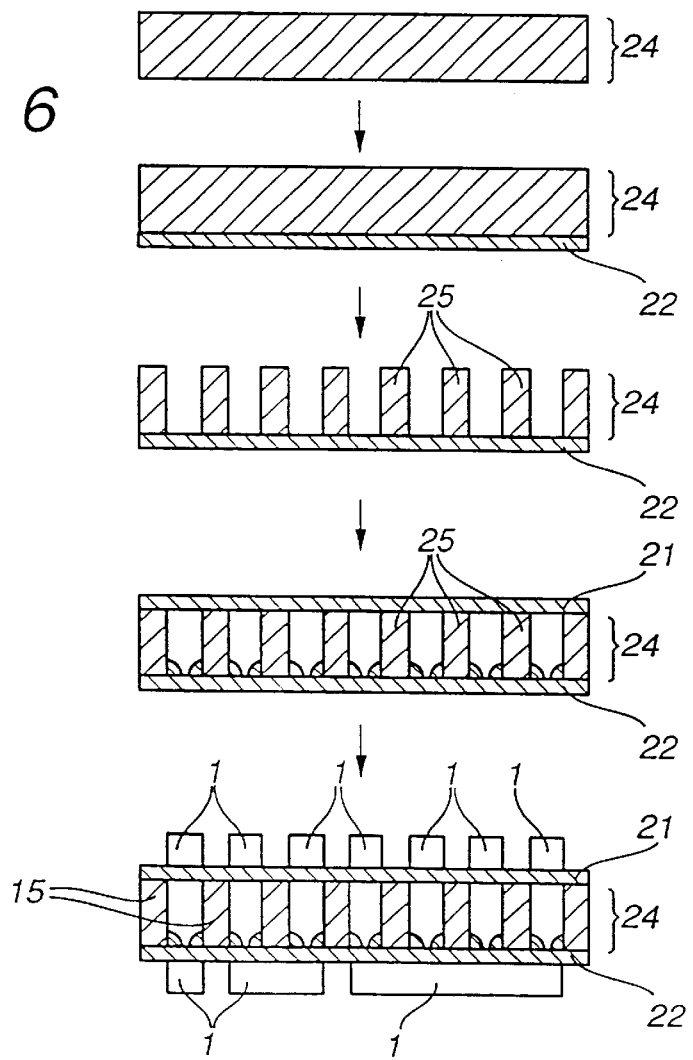
FIG. 6 is a schematic flow chart depicting a method according to the invention for making a microcooling device according to FIG. 4, starting from a base substrate without recesses.

FIG. 5 shows a third embodiment of a base substrate 34 for a microcooling device. The base substrate 34 according to FIG. 5, which is substantially similar to the base substrate 24 depicted in FIG. 3, differs only in that the ribs 25, which in the base substrate 24 of FIGS. 3 and 4 comprised ribs 25 aligned parallel to one another, are interrupted along their length and now constitute protrusions 35 which extend up from the additional cover layer 32 of diamond. The protrusions 35 are arranged in a checkerboard or pillar-like manner on the additional cover layer 32 and simultaneously form spacers between the two diamond cover layers 31 and 32.

This design results in a microcooling device with a base substrate 34 according to FIG. 5 which, of all the disclosed embodiments, has the greatest contact surface between the diamond cover layer and the coolant.

The method according to the invention will be described with reference to a representative example illustrated by means of a cross-sectional view in the nature of a flow diagram for the production of a microcooling device 20 according to FIG. 4, beginning with a base substrate 24 without recesses 13.

At the beginning of the production method, the base substrate plate 24 is cleaned. Then the lower cover layer 22, particularly preferably a diamond layer, is disposed on one preferably flat side of the cleaned base substrate. This cover layer 22 is preferably applied by vapor phase deposition by means of a known CVD process.

In some cases, however, it may be a useful alternative to attach the additional cover layer 22 by bonding, preferably by soldering, a free-standing cover layer 22 onto one flat side of the base substrate. Suitable solders include metal alloys such as titanium-gold-platinum alloys (Ti—Au—Pt alloy); also titanium (Ti), titanium nitride (TiN) and antimony-tin (SbSn).

After the cover layer 22 has been applied, a photo varnish (not shown) is applied to the bare flat side 2 of the base substrate 24, the photo varnish is exposed to form a mask for the etching according to the desired layout of the recesses 23 which form the channel structure and, if desired, the transverse recesses 28 which form the inlet channel 26 and the outlet channel 27. The recesses 23 and 28 then are produced by selective etching in a known manner.

In the illustrated embodiment, care must be taken to assure that during the selective etching the etching is carried out all the way down to the lower cover layer 22, and that the recesses 23 and transverse recesses 28 have a ratio of their depth, which in the present case corresponds to the distance between the two cover layers 21 and 22, to their width, which is always greater than 0.5.

After the selective etching, the upper cover layer 21 of diamond is deposited from the vapor phase by means of a known CVD process onto the structured flat side 2 of the base substrate 24 opposite the lower cover layer 22. In the vapor deposition, at least during the nucleation stage, it is advantageous to apply a negative electrical potential relative to the gaseous phase to the base substrate 24, as disclosed in published German Patent Application No. DE 4,233,085.

During this vapor deposition, diamond is also deposited on the lower cover layer 22 between the ribs 25 on the face which carries the ribs, and yet due to the above-mentioned ratio of the depth to the width of the recesses 23 and transverse recesses 28, the channel structure is not completely filled up.

To improve heat removal, it may prove useful in many cases to reduce the thickness of the upper cover layer 21 and/or of the lower cover layer 22, by etching for example, before applying the components 1, thus reducing the distance between the coolant channels and the surfaces on which the electronic components are to be mounted and improving heat dissipation.

The reduction of the layer thickness, and especially the reduction of the distance between the faces on the component side and the cooling channels, can be performed also in microcooling devices according to FIG. 2, which have only single cover layer 11. In this case it is especially desirable also to ablate the base substrate 14 from the face opposite the cover layer 11, since on account of the short distance between the cooling channels and the bottom of the recesses 13, there is likewise an improved heat dissipation from the components 1 mounted on this surface.

After the channel structure has been sealingly closed by means of the upper cover layer 21, the cover layers 21 and 22 of the microcooling device are provided with the electronic components 1. Since the lower cover layer 22 of the microcooling device has a greater thickness in the area of the channel structure it is advantageous in this case, when equipping the microcooling device on this side, to provide electronic components 1 which create less waste heat, for example due to lower power losses.

Instead of etching into the base substrate 24 of a microcooling device 20, the two transverse recesses 28 for the inlet passage 26 and the outlet passage 27 can also be produced afterwards on a microcooling device that has already been finished and has one of the channel structures described above.

The foregoing description and examples have been set forth merely to illustrate the invention and are not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for producing a microcooling device having an interior channel structure therein through which a coolant can flow, said method comprising forming channel-like recesses in a face of a base substrate, and thereafter sealingly covering said recesses by vapor depositing a cover layer over said recesses to form channels of the channel structure; said recesses prior to application of the cover layer having a ratio of depth to maximum clear width of at least 0.5; and said cover layer being made of an electrically insulating and heat-conducting material which preferentially grows three-dimensionally when vapor deposited.

2. A method according to claim 1, wherein said cover layer material is diamond.

3. A method according to claim 2, wherein said cover layer is vapor deposited as a layer of polycrystalline diamond composed of crystals having lattice planes with a statistically distributed orientation.

4. A method according to claim 1, wherein a first cover layer is disposed on one flat side of the base substrate, and a second cover layer is disposed on an opposite flat side of the base substrate.

5. A method according to claim 4, wherein said first and second cover layers are vapor deposited on opposite sides of the base substrate.

6. A method according to claim 1, wherein prior to formation of the channel-like recesses in one face of the base substrate, a first cover layer is disposed on an opposite face of the base substrate;

the recesses are then formed in said one face of the base structure, the recesses extending through the base structure to expose said first cover layer at the bottoms thereof; and a second cover layer is thereafter vapor deposited on said one face over said recesses to form said channels of the channel structure.

7. A method according to claim 1, wherein the cover layer is deposited by means of a chemical vapor phase deposition (CVD) process in which a negative electrical potential relative to the vapor phase is applied to the base substrate.

* * * * *